(12) United States Patent
Terui et al.

(10) Patent No.: US 7,556,749 B2
(45) Date of Patent: Jul. 7, 2009

(54) ELECTRON SOURCE

(75) Inventors: Yoshinori Terui, Gunma (JP); Ryozo Nonogaki, Gunma (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 648 days.

(21) Appl. No.: 10/544,227

(22) PCT Filed: Feb. 3, 2004

(86) PCT No.: PCT/JP2004/001035

§ 371 (c)(1),
(2), (4) Date: Aug. 2, 2005

(87) PCT Pub. No.: WO2004/070766

PCT Pub. Date: Aug. 19, 2004

(65) Prior Publication Data

US 2006/0076866 A1 Apr. 13, 2006

(30) Foreign Application Priority Data

Feb. 3, 2003 (JP) ............................. 2003-025718

(51) Int. Cl.
*H01J 1/14* (2006.01)
*H01J 37/26* (2006.01)
*H01J 19/02* (2006.01)
*G01N 23/04* (2006.01)
*G01N 23/225* (2006.01)

(52) U.S. Cl. ............. 252/518.1; 252/519.1; 313/346 R; 313/337; 313/310; 313/441; 315/5.34; 315/111.81; 250/396 ML; 250/310; 250/311; 430/296

(58) Field of Classification Search .......... 252/301.4 R, 252/518.1, 520.2; 313/346 R, 309, 311, 313/336, 351, 491, 631; 438/20; 257/164, 257/165; 423/598, 600, 594.12
See application file for complete search history.

(56) References Cited

U.S. PATENT DOCUMENTS 5,733,688 A * 3/1998 Kato et al. ..................... 430/5
(Continued)

FOREIGN PATENT DOCUMENTS

JP 8-36981 2/1996
(Continued)

OTHER PUBLICATIONS

Dinan et al, "A Field-Electron Emission Determination of the Work Function of the Tungsten (211) Plane," Accession No. AD0660210, Nortre Dame University, Sep. 15, 1967, p. 1.*
(Continued)

*Primary Examiner*—Stanley Silverman
*Assistant Examiner*—Kallambella Vijayakumar
(74) *Attorney, Agent, or Firm*—Oblon, Spivak, McClelland, Maier & Neustadt, P.C.

(57) ABSTRACT

To provide an electron source to be used for a surface analyzer such as a scanning or transmission electron microscope or an Auger electron spectroscope, or an electron beam lithography machine, particularly for a semiconductor wafer inspection apparatus such as a scanning electron microscope to be used at a low acceleration with an electron beam acceleration voltage of up to 1 kV, CD SEM or DR SEM. An electron source wherein a barium supplying source consisting of a complex oxide comprising barium oxide and an oxide of metal other than barium, is provided at a portion of a single crystal needle of tungsten or molybdenum.

12 Claims, 4 Drawing Sheets

U.S. PATENT DOCUMENTS

| | | | | |
|---|---|---|---|---|
| 5,744,905 | A | * | 4/1998 | Mehrotra et al. ............. 313/491 |
| 5,911,919 | A | * | 6/1999 | Billings ...................... 252/516 |
| 6,124,667 | A | * | 9/2000 | Komiya et al. .......... 313/346 R |
| 6,432,325 | B1 | * | 8/2002 | Hamada et al. .......... 252/518.1 |

FOREIGN PATENT DOCUMENTS

| | | | |
|---|---|---|---|
| JP | 09-270240 | * | 10/1997 |
| JP | 10-154477 | * | 6/1998 |
| JP | 11-185681 | | 7/1999 |
| JP | 11-288658 | | 10/1999 |
| JP | 11-354007 | | 12/1999 |
| JP | 2000-340096 | | 12/2000 |
| JP | 2001-167687 | | 6/2001 |
| JP | 2001-325910 | * | 11/2001 |
| JP | 2003-31170 | | 1/2003 |

OTHER PUBLICATIONS

Sendecki et al, "A point field emission tungsten cathode obtained by faceting of the tungsten surface induced by ultrathin gold film observations by means of scanning field emission microscope (SFEM)," Applied Surface Science, 1998, V134, pp. 243-246.*

Bhavani et al, "Effect of an electric field on the oxidation of aluminum at room temperature," Bull. Mater. Sci., 1980, V.2, No. 4, pp. 265-270.*

* cited by examiner

Symbol × shows an electron beam emission axis.

ELECTRON SOURCE

TECHNICAL FIELD

The present invention relates to an electron source for a scanning electron microscope, a transmission electron microscope, and a surface analysis apparatus such as an Auger electron spectroscope, a semiconductor wafer inspection apparatus or an electron beam lithography machine, particularly an electron source to be used for a scanning electron microscope, and a wafer inspection apparatus such as CD and DR SEM, of which electron beam is at a low accelerating voltage up to 1 kV.

BACKGROUND ART

In recent years, in order to obtain an electron beam having higher brightness, a Schottky electron emission source (hereinafter referred to also as an electron source) employing a needle electrode of tungsten single crystal, has been used. This electron source is one wherein a covering layer comprising zirconium and oxygen (hereinafter referred to as a ZrO covering layer) is formed on a tungsten single crystal needle having an axial orientation being <100> orientation, and by such a ZrO covering layer, the work function of the (100) crystallographic plane of tungsten single crystal is reduced from 4.5 eV to 2.8 eV. With this electron source, only the very small crystallographic facet corresponding to the (100) crystallographic plane formed at the apex of the needle becomes an electron emission area, whereby an electron beam having a higher brightness than by a conventional thermionic cathode can be obtained. It is known that this (100) crystallographic plane can be developed by applying a negative high voltage to the tungsten single crystal needle, i.e. by balancing the electrostatic stress by the high electric field with the surface tension at the apex of the needle. Further, this electron source has characteristics such that it has a long life, is more stable than a cold field emission cathode and is operable even with a high pressure and easy to use.

As shown in FIG. 1, in an electron source, a tungsten needle 1 having <100> orientation which emits an electron beam, is fixed by e.g. welding to a predetermined position of a tungsten filament 3 provided on conductive terminals 4 fixed to an insulator 5. A zirconium- and oxygen-supply source 2 is formed at a portion of the needle 1. Although not shown in the drawings, the surface of the needle 1 is covered with a ZrO covering layer.

The needle 1 is Joule heated by the filament 3 and used usually at a temperature of about 1,800 K. Accordingly, the ZrO covering layer on the surface of the needle 1 will be lost by evaporation. However, from the supply source 2, zirconium and oxygen will diffuse and will be continuously supplied to the surface of the needle 1, and consequently, the ZrO covering layer will be maintained.

In e.g. a scanning electron microscope or a semiconductor inspection apparatus such as CD SEM or DR SEM, an electron source having a covering layer of zirconium and oxygen formed on a tungsten single crystal needle 1 having <100> orientation, i.e. a ZrO/W Schottky electron source, is widely used, since it has a high brightness and a long life. Further, in such a device, it is common to employ a low acceleration electron beam of at most 1 kV for the observation and measurement of a test sample as it is.

In a case where a low acceleration electron beam is used, the diameter of the electron beam demagnified by a lens, is governed by a chromatic aberration (e.g. J. Pawley, Journal of Microscopy, 136, Pt1, 45 (1984)). In order to reduce such a chromatic aberration, it is necessary to reduce the energy spread of electrons emitted from the electron source. The energy spread of the Schottky electron emission source will not be lower than 2.45 $K_B T$ even at the minimum. Here, $K_B$ is a Boltzmann constant, and T is the absolute temperature at the electron emission area "R. D. Young, Phys. Rev. 113 (1959) p 110". Accordingly, it is effective to lower the operation temperature of the electron source in order to reduce the chromatic aberration, but on the other hand, in the Schottky electron emission or thermionic emission, when the operation temperature is lowered, the emission current dramatically decreases. Therefore, in order to lower the operation temperature of the electron source, an electron source having a low work function must be used. From the foregoing viewpoint, a research for an adsorption species on a tungsten single crystal having a low work function relating to a ZrO adsorption layer, and on its supply source has been actively conducted in recent years (e.g. H. Nishiyama, T. Ohshima, H. Shinada, Applied Physics, Vol. 71, No. 4 (2002) p 438, or H. Nishiyama, T. Ohshima, H. Shinada, Applied Surface Science 146 (1999), p 382, or Y. Saito, K. Yada, H. Ando, Shingakugihou ED2001-175 (2001-12) p 15).

On the other hand, a disperser cathode, a L-type cathode or an impregnated cathode has been known since long ago, as an electron source for a cathode ray tube, wherein barium oxide, barium carbonate, or barium oxide and calcium oxide, aluminum oxide or the like, are added to tungsten, followed by sintering, to form an adsorption layer of Ba or BaO on the surface of a tungsten sintered body thereby to lower the work function (e.g. A. H. W. Beck, The Institution of Electrical Engineers, Paper No. 2750R, November 1958, p 372, as summarized on p 378-381).

An impregnated cathode is operated at a temperature of from about 1,000 to 1,300 K. Accordingly, by forming a BaO adsorption layer on a tungsten single crystal by a similar method, the reduction of the work function will proceed. Thus, it is easily expected that electron emission with a low energy spread can be carried out by the operation at a temperature of from about 1,000 to 1,300 K.

Apart from the energy spread in the operation at a low acceleration voltage, attention is drawn to an operating angular intensity in an application wherein the throughput is of importance. A high throughput is required in an application to an electron beam lithography apparatus or DR SEM. In such an application, a ZrO/W Schottky electron source is operated at a high angular current density of about 0.4 mA/sr, and a HfO/W Schottky electron source has been proposed to meet the requirement for a higher angular current density operation (JP-A-2001-319559).

An electron source is known wherein a barium-supplying source made of barium oxide or (Ba, Sr, Ca) oxide, is formed at a portion of tungsten single crystal to let barium diffuse on the surface of the tungsten single crystal thereby to lower the work function to a level of 1.2 eV, so that the electron source is operated at a low temperature of about 1,000 K. Although not directly verified, this electron source is considered to have a BaO adsorption layer on a tungsten single crystal (H. Nishiyama, T. Ohshima, H. Shinada, Applied Physics, Vol. 71, No. 4 (2002) p 438, or JP-A-10-154477). In this study, it is reported that in a case where a BaO adsorption layer is formed on a needle of tungsten single crystal having <100> orientation by means of a (Ba, Sr, Ca) oxide, in its operation at 1,000 K after heat treatment at a temperature of at least 1,500 K, the electron emission is confined at a narrow angle along the emission axis, thus showing preferred emission characteristics as an electron source. However, on the other hand, it is stated that the time for stable operation is very short at a level of a few hours, and it will be required to carry out thermal treatment at a temperature of at least 1,500 K repeatedly, which is considered to be not practically useful for industrial application. Further, a case wherein barium oxide is used as a supply source, has also been reported, but in such a case, it is pointed out that the electron emission will be of four fold symmetrical and can not uniformly be confined along the emission axis, and the reproducibility is poor.

JP-A-2001-319559 discloses a HfO/W Schottky electron source whereby at an operation angular intensity of 1.0 mA/sr, the total emission current is at most 350 μA, but in recent years, a still higher angular intensity operation (from 3 to 5 mA/sr) has been required. In such an extremely high angular intensity operation, the total emission current will also be high. Accordingly, electrons will be impinged on an extractor electrode or a metal aperture on the electron beam emission axis, whereby it frequently occurs that the outgasing will be remarkable, and ions formed by a collision of electron rays with the gas, will bombard the electron source to give a damage thereto, or will cause an arc discharge thereby to destroy the electron source.

DISCLOSURE OF THE INVENTION

Under the above circumstances, the present inventors have conducted various studies and as a result, have found a supply source which is suitable for forming a BaO-containing adsorption layer on a tungsten or molybdenum single crystal, thus have solved the above problems and have arrived at the present invention.

Namely, the present invention provides the following.

(1) An electron source characterized in that a barium-supplying source consisting of a complex oxide comprising barium oxide and an oxide of metal other than barium, is provided at a portion of a single crystal needle of tungsten or molybdenum.

(2) The electron source according to the above (1), wherein the metal other than barium is at least one metal element selected from the group consisting of Groups IIIA, IVB and IIIB of the Periodic Table.

(3) The electron source according to the above (1) or (2), wherein the complex oxide is at least one complex oxide selected from the group consisting of $BaAl_2O_4$, $BaAl_{12}O_{19}$, $Ba_3Sc_4O_9$, $BaSc_2O_4$, $BaTiO_3$, $BaZrO_3$ and $BaHfO_3$.

(4) The electron source according to any one of the above (1) to (3), wherein a part of barium of the barium oxide is substituted by a Group IIA element other than barium.

(5) The electron source according to any one of the above (1) to (4), wherein the single crystal needle of tungsten or molybdenum has a <100> orientation and has a flat surface consisting of a (100) crystallographic plane at the apex of the needle.

(6) The electron source according to any one of the above (1) to (4), wherein the single crystal needle of tungsten or molybdenum has a <211> orientation and has a flat surface consisting of a (211) crystallographic plane at the apex of the needle.

(7) The electron source according to any one of the above (1) to (6), wherein when it is operated at an angular intensity of 4.0 mA/sr, the total radiation current is at most 350 μA.

(8) The electron source according to any one of the above (1) to (7), which is an electron source to be used for a scanning electron microscope, a transmission electron microscope, a surface analyzer, a wafer inspection apparatus or an electron beam lithography apparatus.

(9) A method for using an electron source, characterized in that an electron source provided with a barium-supplying source consisting of a complex oxide comprising barium oxide and an oxide of metal other than barium at a portion of a single crystal needle of tungsten or molybdenum, is used at a needle temperature of from 1000 K to 1300 K.

(10) A method for producing an electron source, characterized in that an electron source provided with a barium-supplying source consisting of a complex oxide comprising barium oxide and an oxide of metal other than barium at a portion of a single crystal needle of tungsten or molybdenum, is heated at from 1000 K to 1700 K under application of a positive electric potential.

MEANINGS OF SYMBOLS

Figure 1:
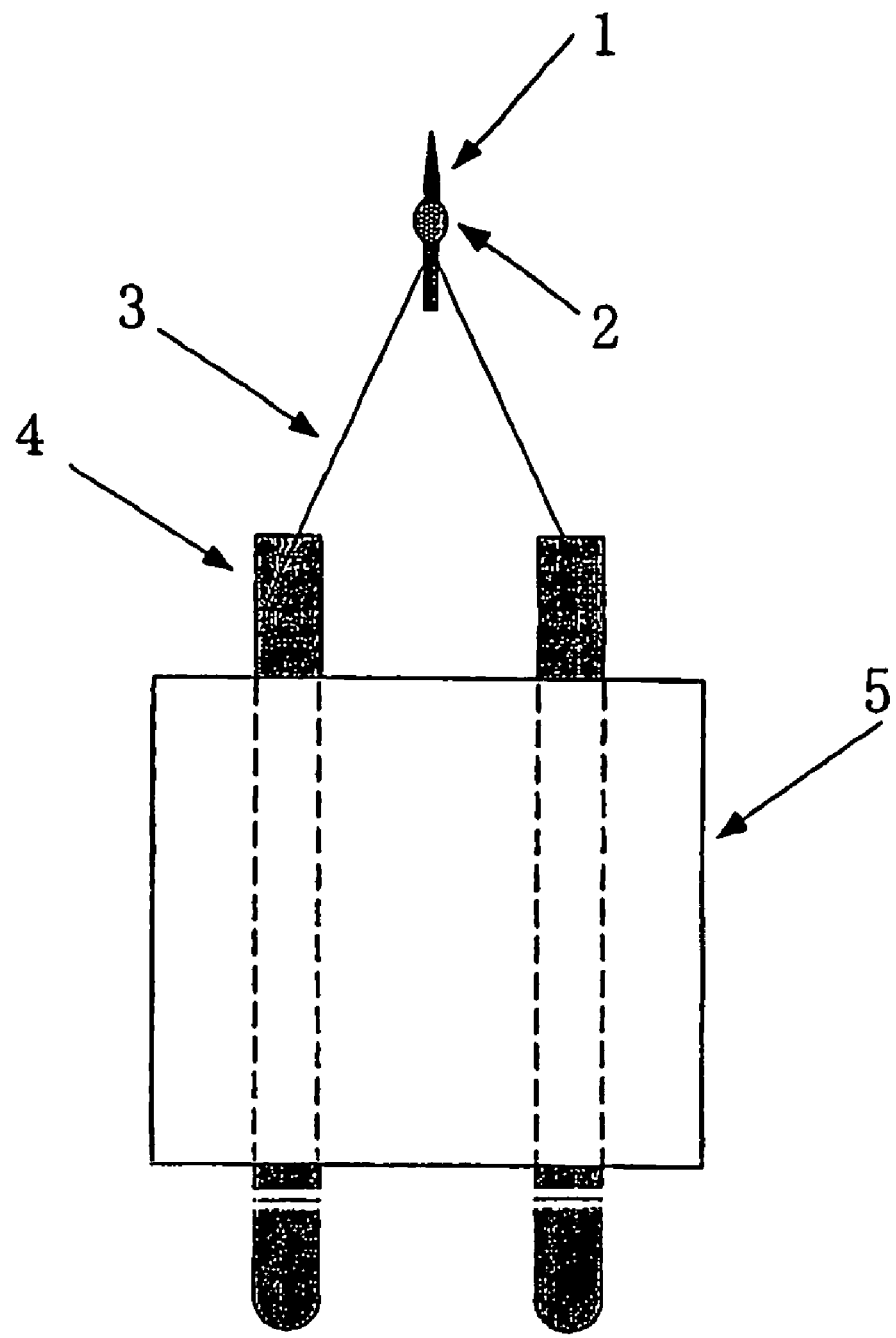
FIG. 1 is a schematic structural view of an electron source.

1: Needle
2: Supply source
3: Filament
4: Conductive terminal
5: Insulator
6: Suppressor electrode
7: Extractor electrode
8: Phosphorous screen
9: Aperture
10: Cup-shaped electrode
11: Electric current ammeter for measuring probe electric current
12: Bias power source
13: High voltage power source
14: Filament-heating power source
15: Ammeter for measuring total emission current
16: Emitted electron beam

BEST MODE FOR CARRYING OUT THE INVENTION

A specific embodiment of the present invention is an electron source (BaO/W emitter) wherein a covering layer of barium and oxygen is formed on a needle of tungsten or molybdenum single crystal having <100> orientation or <211> orientation, which is obtained by forming, as a barium-supply source, a complex oxide comprising barium oxide and an oxide of metal other than barium, at one portion of the single crystal needle. The metal element other than barium in the complex oxide containing an oxide of metal other than barium, may preferably be at least one metal element selected from the group consisting of Group IIIA (boron, aluminum, gallium, indium and thallium), Group IVB (titanium, zirconium and hafnium) and Group IIIB (scandium, yttrium, lanthanide elements and actinoid elements) of the periodic table (short period type). The above complex oxide is particularly preferably at least one complex oxide selected from the group consisting of $BaAl_2O_4$, $BaAl_{12}O_{19}$, $Ba_3Sc_4O_9$, $BaSc_2O_4$, $BaTiO_3$, $BaZrO_3$ and $BaHfO_3$.

Further, a part of barium of the barium oxide may be substituted by a Group IIA element other than barium (such as magnesium, calcium or strontium). Further, the supply source may contain, in addition to the complex oxide, free barium oxide or carbonate, or other metal oxides.

The electron source of the present invention can be used within a temperature range of from 900 to 1,450 K, preferably from 1,000 to 1,300 K.

Further, the electron source of the present invention is operable at a temperature extremely lower than 1,800 K which is the operation temperature of a ZrO/W Schottky electron source, and therefore, it can contribute to improvement of the resolution of a semiconductor wafer inspection apparatus or a scanning electron microscope employing a low acceleration electron beam with a small energy spread. Further, by the electron source of the present invention, the total emission current is small at a level of at most 350 µA even in a high angular intensity operation of at least 4.0 mA/sr, whereby possibility of breakage of the electron source by ionic damage or arc is low, and high reliability can be attained.

The BaO adsorption layer has a substantial effect to lower the work function, and as known as an oxide cathode, an oxide containing barium emits a large amount of thermionic emission at a high temperature. Therefore, a cathode having barium oxide as a supply source, will emit thermionic electrons in a large amount not only at the surface of the tungsten single crystal needle but also from the supply source made of barium oxide, when a negative high voltage is applied to the cathode by heating in vacuum. Such thermionic electrons will bombard an anode to induce gas discharge, which is further ionized by an electron beam to generate arc discharge, whereby probability of breaking the single crystal needle will be extremely high. Therefore, it may frequently happen that no sufficient electric field can be applied to the single crystal needle, and no adequate crystallographic plane can be developed at the apex of the single crystal needle.

Whereas, according to the method of the present invention, a positive electric potential is applied to the single crystal needle, whereby no emission of electrons will be accompanied, and no ionization of the residual gas takes place to cause arc discharge. Accordingly, a high voltage required to develop a sufficient crystallographic plane at the apex of the single crystal needle, can be applied, and the development of the sufficient crystallographic plane contributes to reduction of noise in the emission current. Here, the voltage to be applied is from $4\times10^6$ V/cm to the maximum of $2\times10^7$ V/cm, as calculated as the electric field strength. Further, for the development of the crystallographic plane, mass transfer at the apex of the single crystal needle will be accompanied, and accordingly, the higher the temperature, the better. However, in order to avoid rapid evaporation and loss of the supply source, the temperature is preferably at most 1,700 K. On the other hand, if the temperature is low, mass transfer will be suppressed, and the crystallographic plane will not be adequately developed. Accordingly, the temperature is preferably at least 1,000 K. The temperature is particularly preferably from 1,350 to 1,650 K.

Thus, by applying a positive electric potential to a single crystal needle having a barium-supplying source comprising barium oxide and an oxide of metal other than barium at a portion of the single crystal needle of tungsten or molybdenum to heat it preferably at a temperature of from 1,000 K to 1,700 K, it is possible to prepare a stabilized electron source efficiently in good yield while frequency of arc discharge can be substantially suppressed.

EXAMPLES

Now, the present invention will be described in further detail with reference to Examples. However, it should be understood that the present invention is by no means restricted to such Examples.

A tungsten filament was fixed by spot welding to conductive terminals brazed to electric glass, and then, a needle obtained by cutting a single crystal tungsten thin wire having <100> orientation, was attached by spot welding to the above filament and further electropolished so that the curvature radius of the apex of the needle would be about 1 µm, to obtain an intermediate of electron source.

Further, as a material constituting the supply source, comparison was made by using each of a commercially available barium aluminate ($BaAl_2O_4$) powder, a barium oxide powder, a mixture of barium oxide, calcium oxide and aluminum oxide powders (molar ratio of 5:3:2), and a mixture of barium oxide, strontium oxide and calcium oxide powders (molar ratio of 5:4:1). Using isoamyl acetate as a dispersant, each powder was pulverized in a mortar to obtain a slurry. The slurry was applied to the needle of the above intermediate of electron source (at a center position between the fixed position to the filament and the apex of the needle) to preliminarily form a supply source.

Figure 2:
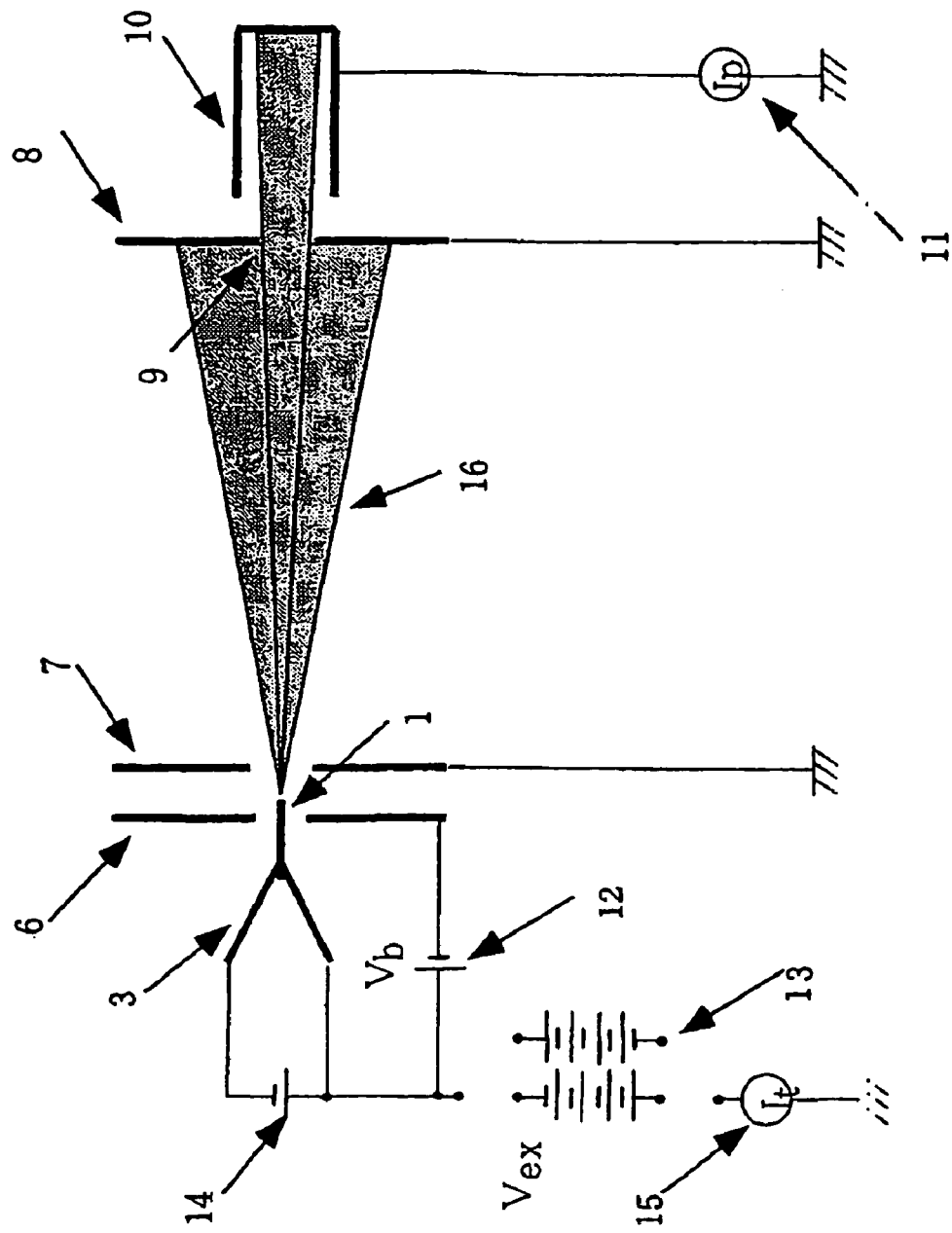
FIG. 2 is a schematic structural view of an apparatus for evaluating electron emission characteristics.

After evaporation of isoamyl acetate in the slurry, the needle was introduced into an apparatus shown in FIG. 2.

The apex of the needle 1 is disposed between a suppresser electrode 6 and an extractor electrode 7. Here, the distance between the apex of the needle 1 and the suppresser electrode 6 is 0.25 mm, the distance between the suppresser electrode 6 and the extractor electrode 7 is 0.6 mm, the pore size of the extractor electrode 7 is 0.6 mm, and the pore size of the suppresser electrode 6 is 0.4 mm.

The filament 3 is connected to a filament heating power source 14 and further connected to a high voltage power source 13 whereby the polarity can be changed as the case requires. To the extractor electrode 7, a negative high voltage i.e. extraction voltage Vex, will be applied. Further, the suppresser electrode 6 is connected to a bias power source 12, and to the needle 1 and the filament 3, a further negative voltage i.e. bias voltage Vb, will be applied. Thermionic electrons emitted from the filament 3 will thereby be shielded. The total emission current It from the electron source is measured by an ammeter 15 disposed between the high voltage power source 13 and an earth. The electron beam 16 emitted from the apex of the needle 1 will pass through a pore of the extractor electrode 7 and reach a phosphorous screen 8. At the center of the phosphorous screen 8, there is an aperture 9 (a small pore), and a probe electric current Ip passed through the aperture 9 and reached a cup-shaped electrode 10, will be measured by an electric current ammeter 11. Further, when a solid angle calculated from the distance between the aperture 9 and the apex of the needle 1 and the inner diameter of the aperture 9, is represented by ω, the angular intensity will be Ip/ω.

Examples 1 to 4

An electron source having barium aluminate as a supply source, is introduced into a vacuum chamber, and the chamber is evacuated to an ultrahigh vacuum of $3\times10^{-10}$ Torr ($4\times10^{-8}$ Pa), whereupon an electric current is conducted to the filament 3 to heat the needle 1 at 1,500 K thereby to turn on the supply source.

Thereafter, two types i.e. ones following procedure 1 and procedure 2 (Examples 1 and 2) and ones following procedure 1' and procedure 2 (Examples 3 and 4), were compared.

Procedure 1: While the needle was maintained at from 1,000 to 1,600 K and the bias voltage of the suppresser was Vb=0 V, a positive high voltage was applied to the needle and maintained for a few tens hours.

Procedure 1': While the needle was maintained at from 1,000 to 1,600 K, a bias voltage of a few hundreds V was applied to the suppresser, and a negative high voltage was applied to the needle and maintained for a few tens hours.

Procedure 2: The needle was set at an operation temperature of from 1,000 to 1,300 K, and a bias voltage was applied to the suppresser, and then a negative high voltage was applied to the needle 1.

In procedure 1, a positive high voltage of 6 kV at the maximum was applied. With respect to those treated in the order of procedures 1 and 2, when an extraction voltage of Vex=3 kV was applied to the needle 1 at a bias voltage of 50 V in procedure 2, the emission current gradually increased with all electron sources.

In Example 3, the electron emission beam observed on the phosphorous screen 8 was in four fold symmetry on the electron emission axis as shown in FIG. 3(a), and the probe electric current on the axis was weak, but with an increase of the emission current, the probe electric current on the axis gradually increased (FIG. 3(b)). Thereafter, the operation temperature was further lowered to 1,100 K, and the extraction voltage was further lowered to 1 kV, and the electron emission was continued for 12 hours, whereby the pattern of the electron emission beam on the phosphorous screen 8 was axially symmetric and one to irradiate the axis, as shown in FIG. 3(c). Further, a probe electric current corresponding to an angular intensity of 1 mA/sr was observed, and thereafter, a constant electron emission over a period of 1,500 hr was confirmed. Further, during this period, thermal treatment at a temperature of at least 1,500 K was only once at the beginning, and it was not required to repeat such thermal treatment. Further, from the relations between the extraction voltage-angular intensity and the extraction voltage-total emission current, the total emission current was about 120 µA during the operation at 4 mA/sr and was confirmed up to an operation angular intensity of 10 mA/sr (FIG. 4).

However, with those following procedures 1' and 2 (Examples 3 and 4), the emission current increased abruptly at the initial stage of application of the high voltage, arc discharge occurred frequently, whereby the needle 1 was broken, or in order to prevent an increase of the emission current, it was possible only to apply a low negative voltage. Infrequently, there was one which reached the electron emission beam pattern as shown in FIG. 3(c), but the crystallographic plane was not adequately developed, and the noise in the probe electric current was large.

Thereafter, the electric source was taken out from the apparatus, and the apex of the tungsten needle was observed by a scanning electron microscope, whereby it was confirmed that a flat (100) crystallographic plane was formed at the apex of the needle. Especially with ones treated in the order of procedures 1 and 2 (Examples 1 and 2), the diameter of the crystallographic plane formed at the apex of the needle 1 was larger than those following procedures 1' and 2 (Examples 3 and 4).

Comparative Examples 1 to 12

Then, the results of electron sources are summarized in a Table, wherein the supply source was constituted by barium aluminate, or other materials. Other materials have high vapor pressures and are readily exhaustible, and they are thus not suitable for treatment at a high temperature for a long period of time. On the other hand, barium aluminate is not exhaustible even by treatment at a high temperature for a long period of time, whereby an electron source having preferred characteristics can easily be obtained.

The results of the foregoing Examples 1 to 4 and Comparative Examples 1 to 12 are shown in Table 1. As is apparent from such Table 1, the electron source of the present invention has a characteristics that it is operable constantly for a long period of time, and particularly, according to the present invention, it is possible to obtain an electron source whereby the noise in the probe electric current is extremely small.

INDUSTRIAL APPLICABILITY

The electron source of the present invention is a BaO/W Schottky electron source having a BaO adsorption layer and being capable of stable operation for a long time, and does not require heat treatment at a high temperature of at least 1,500 K for a number of times at a rate of once every a few hours as required in the prior art, and can be operated at from 1,000 to 1,300 K whereby an operation with a low energy spread is possible. Under an operation condition such that the angular intensity is 4.0 mA/sr, the total emission current is suppressed to a level of not higher than 350 µA, whereby it is possible to suppress the decrease in reliability such that the electron emission characteristics deteriorate due to the gas discharge from the extractor electrode or the metal aperture unit during the operation at a high angular intensity, or the apex of the needle is damaged by an arc, which used to be problematic. Further, it is possible to improve the throughput of an electron beam application instrument such as an electron beam lithography machine or DR-SEM.

Further, according to the method of the present invention, it is possible to reduce the breakdown probability of the needle due to the arc discharge during the preparation and to produce an electron source whereby electron emission can be carried out with little noise.

TABLE 1

| | Treatment | Material constituting the supply source | Operation temperature and time |
|---|---|---|---|
| Ex. 1 | Procedures 1 and 2 | Barium aluminate (BaAl$_2$O$_4$) | 1,500K 40 hr 1,100K 1,500 hr or more |
| Ex. 2 | | | 1,450K 78 hr 1,100K 760 hr or more |
| Comp. Ex. 1 | | Barium oxide (BaO) | 1,080K 150 hr whereupon terminated |
| Comp. Ex. 2 | | | 1,200K 50 hr whereupon terminated |
| Comp. Ex. 3 | | Barium oxide, calcium oxide, aluminum oxide (BaO, CaO, Al$_2$O$_3$) molar ratio = 5:3:2 | 1,300K 200 hr whereupon terminated |
| Comp. Ex. 4 | | | 1,300K 230 hr whereupon terminated |
| Comp. Ex. 5 | | Barium oxide, strontium oxide, calcium oxide | 1,500K 30 hr whereupon terminated |
| Comp. Ex. 6 | | | 1,500K 30 hr whereupon terminated |
| Ex. 3 | Procedures 1' and 2 | Barium aluminate (BaAl$_2$O$_4$) | 1,500K 60 hr 1,100K 200 hr or more |
| Ex. 4 | | | 1,450K 92 hr 1,100K 200 hr or more |
| Comp. Ex. 7 | | Barium oxide (BaO) | 1,080K 150 hr whereupon terminated |
| Comp. Ex. 8 | | | 1,200K 50 hr whereupon terminated |
| Comp. Ex. 9 | | Barium oxide, calcium oxide, aluminum oxide | 1,300K 200 hr whereupon terminated |

TABLE 1-continued

| | | |
|---|---|---|
| Comp. Ex. 10 | (BaO, CaO, Al$_2$O$_3$) molar ratio = 5:3:2 | 1,300K 230 hr whereupon terminated |
| Comp. Ex. 11 | Barium oxide, strontium oxide, calcium oxide | 1,500K 30 hr whereupon terminated |
| Comp. Ex. 12 | | 1,500K 30 hr whereupon terminated |

Figure 3:
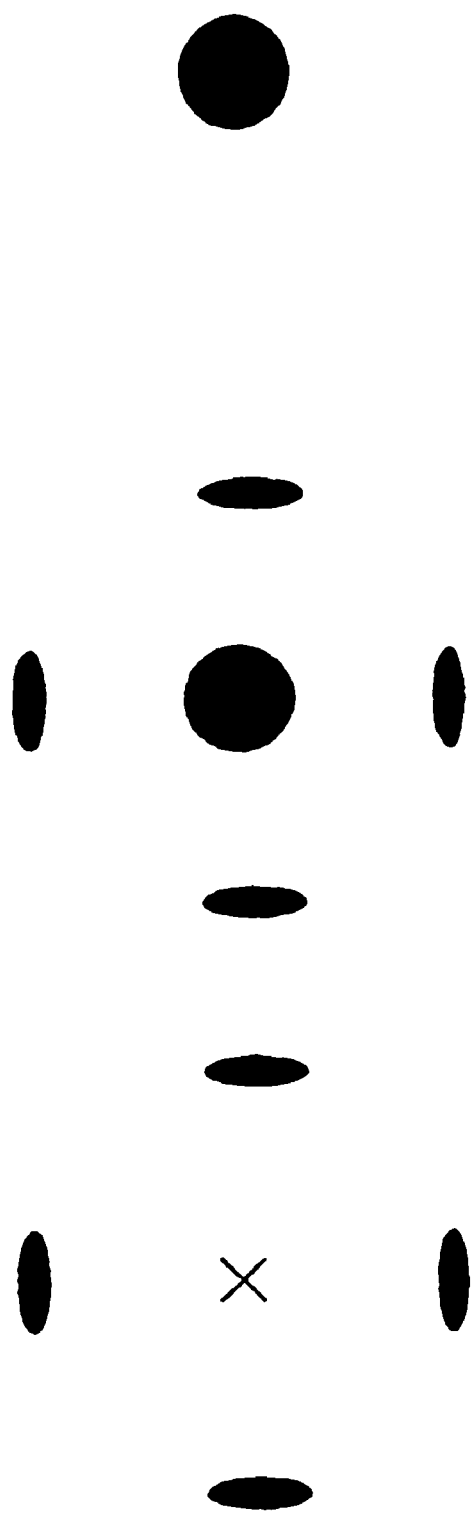
FIG. 3 is an angular distribution pattern of an electron beam as observed on a phosphorous screen.
Figure 4:
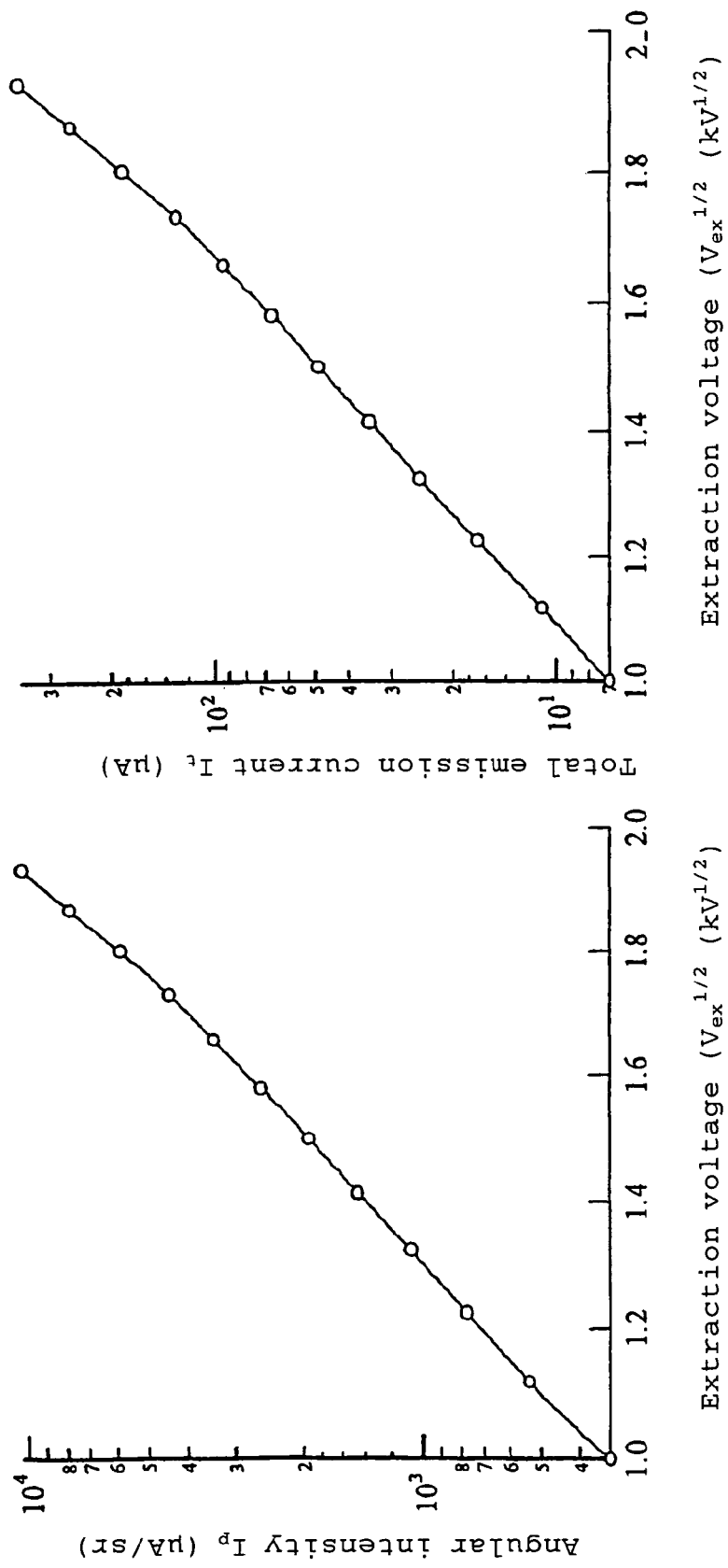
FIG. 4 shows examples of measurement of extraction voltage-angular intensity, and extraction voltage-total emission current.

| | Noise in probe electric current | Diameter of crystallographic facet | Electron emission pattern |
|---|---|---|---|
| Ex. 1 | <1% | 0.7 μm | Corresponds to FIG. 3 (c) |
| Ex. 2 | <1% | 0.7 μm | Corresponds to FIG. 3 (c) |
| Comp. Ex. 1 | | | Corresponds to FIG. 3 (a) |
| Comp. Ex. 2 | | | Corresponds to FIG. 3 (a) |
| Comp. Ex. 3 | | | Corresponds to FIG. 3 (a) |
| Comp. Ex. 4 | | | Corresponds to FIG. 3 (a) |
| Comp. Ex. 5 | | | Corresponds to FIG. 3 (a) |
| Comp. Ex. 6 | | | Corresponds to FIG. 3 (a) |
| Ex. 3 | 12 to 15% | 0.2 μm | Corresponds to FIG. 3 (c) |
| Ex. 4 | 14 to 17% | 0.1 μm | Corresponds to FIG. 3 (c) |
| Comp. Ex. 7 | | | Corresponds to FIG. 3 (a) |
| Comp. Ex. 8 | | | Corresponds to FIG. 3 (a) |
| Comp. Ex. 9 | | | Corresponds to FIG. 3 (a) |
| Comp. Ex. 10 | | | Corresponds to FIG. 3 (a) |
| Comp. Ex. 11 | | | Corresponds to FIG. 3 (a) |
| Comp. Ex. 12 | | | Corresponds to FIG. 3 (a) |

The invention claimed is:

1. An electron source comprising a single crystal needle of tungsten or molybdenum and as a covering layer on a portion of said needle, a barium-supplying source comprising a complex oxide comprising barium oxide, and an oxide of metal other than barium, wherein the complex oxide is at least BaAl$_{12}$O$_{19}$.

2. The electron source according to claim 1, wherein the single crystal needle of tungsten or molybdenum has a <100> orientation and has a flat surface consisting of a (100) crystallographic plane at the apex of the needle.

3. The electron source according claim 1, wherein the single crystal needle of tungsten or molybdenum has a <211> orientation and has a flat surface consisting of a (211) crystallographic plane at the apex of the needle.

4. The electron source according to claim 1, wherein when it is operated at an angular intensity of 4.0 mA/sr, the total emission current is at most 350 μA.

5. An apparatus comprising the electron source according to claim 1, which apparatus is a scanning electron microscope, a transmission electron microscope, a surface analyzer, a semiconductor wafer inspection apparatus or an electron beam lithography machine.

6. A method comprising using the electron source according to claim 1 at a needle temperature of from 1000 K to 1300 K.

7. A method for producing an electron source comprising heating the electron source according to claim 1, at from 1000 K to 1700 K under application of a positive electric potential.

8. The apparatus according to claim 5, which is a scanning electron microscope.

9. The apparatus according to claim 5, which is a transmission electron microscope.

10. The apparatus according to claim 5, which is a surface analyzer.

11. The apparatus according to claim 5, which is a semiconductor wafer inspection apparatus.

12. The apparatus according to claim 5, which is an electron beam lithography machine.

* * * * *